MONOLITHIC CIRCUITS HAVING MATCHED COMPLEMENTARY TRANSISTORS, SUB-EPITAXIAL AND SURFACE RESISTORS, AND N AND P CHANNEL FIELD EFFECT TRANSISTORS

Filed Dec. 13, 1966

Oct. 21, 1969 J. W. KRONLAGE 3,474,308

MONOLITHIC CIRCUITS HAVING MATCHED COMPLEMENTARY TRANSISTORS, SUB-EPITAXIAL AND SURFACE RESISTORS, AND N AND P CHANNEL FIELD EFFECT TRANSISTORS

Filed Dec. 13, 1966 3 Sheets-Sheet 2

Oct. 21, 1969 J. W. KRONLAGE 3,474,308

MONOLITHIC CIRCUITS HAVING MATCHED COMPLEMENTARY TRANSISTORS, SUB-EPITAXIAL AND SURFACE RESISTORS, AND N AND P CHANNEL FIELD EFFECT TRANSISTORS

Filed Dec. 13, 1966 3 Sheets-Sheet 3

3,474,308

MONOLITHIC CIRCUITS HAVING MATCHED COMPLEMENTARY TRANSISTORS, SUB-EPITAXIAL AND SURFACE RESISTORS, AND N AND P CHANNEL FIELD EFFECT TRANSISTORS

John W. Kronlage, Richardson, Tex., assignor to Texas Instruments Incorporated, Dallas, Tex., a corporation of Delaware Filed Dec. 13, 1966, Ser. No. 601,396
Int. Cl. H01l 11/00, 15/00, 5/00
U.S. Cl. 317—235 7 Claims

ABSTRACT OF THE DISCLOSURE

Disclosed are monolithic circuits of the type having matched pairs of complementary transistors formed within respective pockets of an epitaxial layer that extends over one surface of a substrate. Below the emitter and base regions of each transistor is a diffused region of conductivity type opposite to the conductivity of the substrate, and formed within the diffused region below the NPN transistor is a buried region of conductivity type the same as the conductivity type of the substrate for providing a low resistivity path for collector current. In other pockets of the epitaxial layer, there may be formed sub-epitaxial resistors, surface resistors, n-channel field effect transistors and p-channel field effect transistors.

Figures 1A, 1B, 2A, 2B:
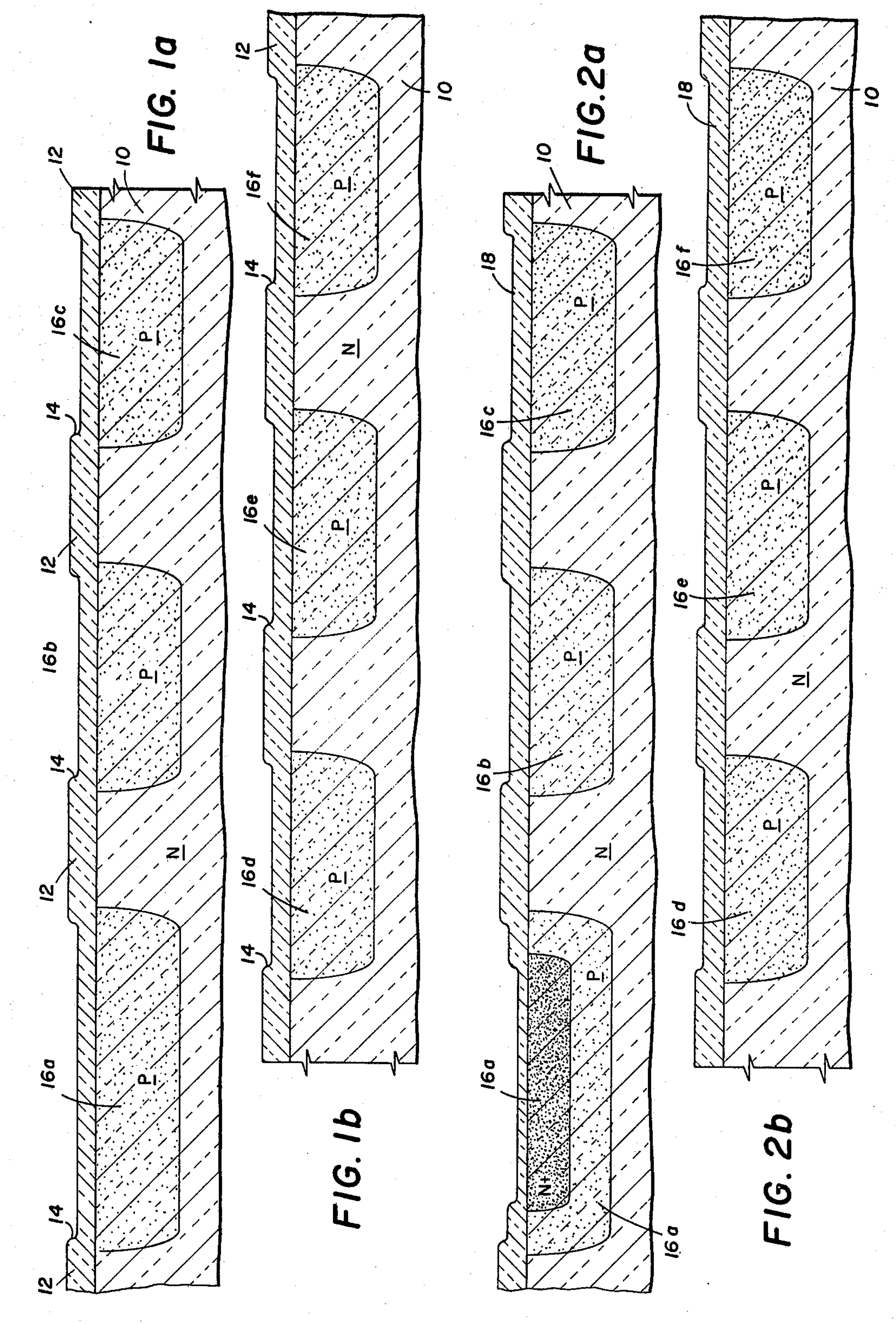

This invention relates generally to integrated circuits, and more particularly, relates to an improved process for concurrently fabricating complementary NPN and PNP transistors as well as improved resistors in integrated circuits, and to the article of manufacture produced by the process.

In the conventional process of fabricating high voltage integrated circuits, four successive diffusions having successively higher impurity concentrations are required in order to form a circuit having both NPN and PNP transistors. Starting with a substrate of n-type conductivity for example, and using conventional masking, etching and diffusion techniques, p-type impurities are diffused to a predetermined depth over regions of the substrate sufficient to convert those regions to p-type conductivity and form the collector regions of PNP transistors. Typically, the starting substrate is silicon doped with about $10^{15}$ atoms/cm.$^3$ of phosphorus, the p-type impurity is boron, and the combined concentration of impurities in the resultant p-type conductivity regions is about $10^{16}$ atoms/cm.$^3$. N-type impurities, such as phosphorous, are diffused into the p-type regions to concurrently form the collector regions of the NPN transistors and the base regions of the PNP transistors. The concentration of the n-type impurities must be sufficient to convert the p-type regions to n-type conductivity, so that the resulting n-type regions typically have an impurity concentration of about $10^{17}$ atoms/cm.$^3$. Then to form the base regions of the NPN transistors and, concurrently, the emitter regions of the PNP transistors, predetermined areas of the n-type regions are converted to p-type regions by a third diffusion step, which typically results in a combined impurity concentration of about $10^{18}$ atoms/cm.$^3$. The p-type impurities of the third diffusion are also typically diffused into virgin areas of the substrate to provide diffused surface resistors because the sheet resistance, which is related to surface concentration and depth, of this diffusion is appropriate for resistors. In the fourth diffusion step, the emitter regions of the NPN transistors are formed by diffusing n-type impurities to a given depth in some of the p-type regions formed by the third diffusion. The resulting impurity concentration of the NPN emitters is typically about $10^{21}$ atoms/cm.$^3$.

Complementary NPN and PNP transistors of integrated circuits fabricated by the conventional method are the products of compromises which must be made in order to concurrently fabricate these devices using an impurity concentration range that for practical reasons is limited to from about $10^{15}$ atoms/cm.$^3$ to about $10^{21}$ atoms/cm.$^3$. As a result the NPN transistors have an inadequate breakdown voltage for many applications. Compared to independently fabricated NPN transistors, concurrently fabricated NPN transistors show notably lower collector breakdown voltages due to the relatively high impurity concentration in the collector regions. Unlike transistors that are constructed independently, where the collector region can be made with a very low impurity concentration to provide optimum collector breakdown voltage, the collector regions of NPN transistors fabricated concurrently with PNP transistors have a practical minimum concentration that is limited to a relatively high value of about $10^{17}$ atoms/cm.$^3$, because the NPN collector is formed by the same diffusion that forms the PNP base.

Further, the collectors of such NPN transistors have significantly higher collector saturation resistances than independently fabricated transistors, which degrade the parameter of integrated circuits so made. Since collector saturation resistance increases with a decrease in the cross-sectional area through which current passes, the diffusion depths or optional layer thicknesses of independently fabricated transistors can be varied to achieve optimum performance for a particular set of operating requirements. With the conventional quadruple diffusion method described above, however, the depth to which n-type impurities can be diffused to form the NPN collector is limited to the depth to which the base region of a PNP transistor can be diffused. The subsequent superimposition of the NPN base and emitter regions in the shallow collector region results in a current path to the collector-base junction of relatively small cross-sectional areas and the collector saturation resistance, accordingly, is increased.

Further, the conventional method has the disadvantage of requiring extraordinary care during the second diffusion which forms the NPN collector and the PNP base because the concentration of n-type impurities of the second diffusion is only slightly greater than the impurity concentration of the first p-type diffusion. Further difficulties are presented when phosphorous is the n-type impurity used because deposited phosphorous reacts peculiarly and uncontrollably to reagents used in the oxide layer deglazing procedure, resulting in nonuniform n-type impurity diffusion depths. Extensive measures are therefore required for quality control, contributing greater cost to the already expensive manufacture of such integrated circuits.

Further, the diffused surface resistors of such conventionally fabricated integrated circuits suffer from several disadvantages. Such resistors, usually formed with the third diffusion that builds the base of an NPN transistor, are limited to a sheet resistance of about 150 ohms. Beyond that, they suffer surface inversion and loss of resistivity. Moreover, they are strongly susceptible to degraded breakdown voltages as a result of surface damage caused by initial material defects and diffusion induced damage. Surface damage and degradation of breakdown voltages account for some of the most severe yield losses of integrated circuits. This is particularly true on circuits requiring a large total circuit resistance because, with sheet resistances limited as a practical matter to about 150 ohms/square, the larger resistances can be produced only by connecting a number of long resistor units in series. This requires very large surface areas which increases the likelihood of surface damage.

In order to overcome the limitations of transistors and resistors in conventionally fabricated integrated circuits, the present invention is directed to a method of fabricating integrated circuits which greatly reduces the necessity of compromising the performance characteristics of NPN and PNP transistors in order to fabricate them concurrently in integrated circuit form. Accordingly, it provides custom circuit designers greater latitude to trade-off one device parameter for another than previously has been possible. Further, this invention provides a method of constructing integrated circuits that is more amenable to tight process control with higher yields than the conventional method, and eliminate the undesirable phosphorous diffusion. The invention is further and importantly directed to a method of fabricating in such circuits, resistors that are immune to surface damage, suffer no surface inversion, and provide a sheet resistance about five times greater than the sheet resistances practically obtainable with the conventional method. Further, the method of this invention permits the simultaneous fabrication of junction-type field effect devices, which provides an additional design tool for integrated circuits.

In accordance with this invention, NPN and PNP transistors having matched performance characteristics can be formed concurrently on a monolithic slice to produce an integrated circuit by a process using four diffusions and an epitaxial step. A first p-type diffusion is performed to form a pair of lightly doped p-type regions in one side of an n-type substrate. Then a lightly doped n-type epitaxial layer is formed over the diffused regions. Then a second p-type diffusion is performed in the epitaxial layer around the periphery of the underlying p-type regions formed by the first diffusion. A first n-type diffusion is then made in the p-type region formed by the second diffusion. The emitter region of the NPN transistor is formed by the first n-type diffusion, the base region by the third p-type diffusion, and the active collector region by the n-type epitaxial layer. An n-type diffusion can also be made in the p-type region underlying the NPN transistor prior to the epitaxial layer to provide a low resistivity collector current path. A collector contact for the NPN transistor can be made by the first n-type diffusion or by a separate diffusion. The emitter region of the PNP transistor is formed by the third p-type diffusion, the base region by the epitaxial layer, and the collector region by the first p-type diffusion.

Thus, the present invention provides a method for fabricating integrated circuits including, minimally, PNP and NPN transistors, and additionally, subepitaxial resistors formed by the first p-type diffusion, surface resistors formed by the third p-type diffusion, and also n-channel and p-channel field effect transistors, and to the resulting integrated circuit devices.

Figures 3A, 3B, 4A, 4B:
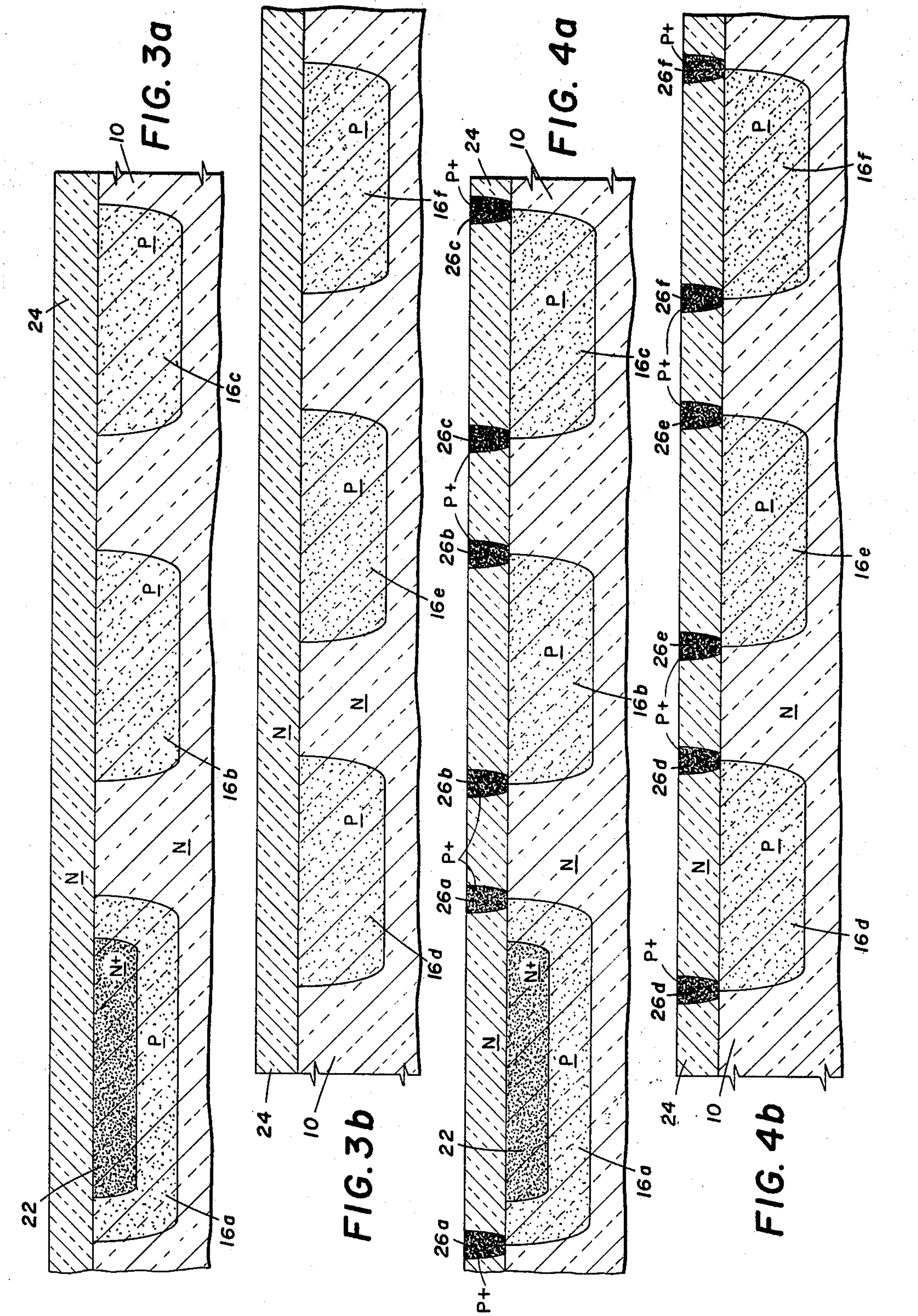
Figures 5A, 5B, 6A, 6B:
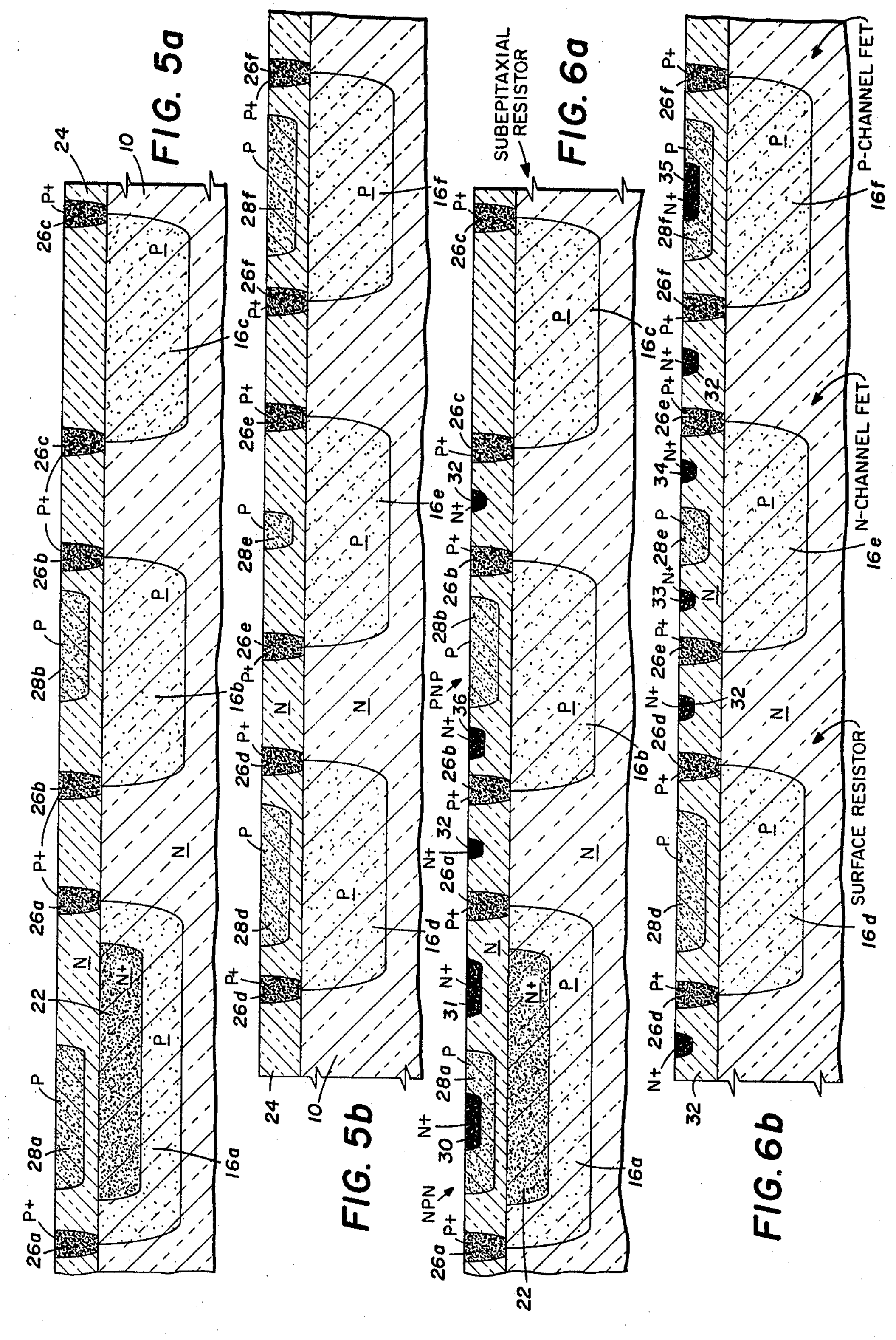

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

FIGURES 1*a* and 1*b*, collectively, show a single substrate after the first p-type diffusion upon which six different circuit devices are to be fabricated concurrently in acordance with the process of this invention;

FIGURES 2*a* and 2*b*, collectively, show the substrate of FIGURES 1*a* and 1*b* after the preepitaxial n-type diffusion step of the process;

FIGURES 3*a* and 3*b*, collectively, show the substrate of FIGURES 2*a* and 2*b* after the formation of an epitaxial layer;

FIGURES 4*a* and 4*b*, collectively, show the substrate of FIGURES 3*a* and 3*b* after the second p-type diffusion step forming isolation rings and collector contacts;

FIGURES 5*a* and 5*b*, collectively, show the substrate of FIGURES 4*a* and 4*b* after the third p-type diffusion step of the process; and FIGURES 6*a* and 6*b*, collectively, show the substrate of FIGURES 5*a* and 5*b* after the first n-type diffusion step of the process and also illustrate a substantially completed integrated circuit constructed in accordance with this invention.

Referring now to the drawings, and particularly to FIGURES 1*a* and 1*b*, the starting material for fabricating integrated circuit devices in accordance with this invention is a slice 10 of single crystal n-type silicon having a polished surface oriented three to five degrees off the 1–1–1 plane. The siilicon may be doped with phosphorous and typically has a resistivity of about 10–20 ohm-cm. Each of the individual diffusion steps herein described may be carried out using conventional techniques which are well known and will not herein be described in detail. The first diffusion step is made through a silicon dioxide or other conventional masking layer 12 formed over one surface of substrate 10 and having diffusion windows 14 formed over predetermined areas of the substrate. A p-type impurity, preferably boron, is diffused through the window 14 in a conventional manner to form p-type conductivity regions **16*a*–16*f*. This diffusion, which is of a noncritical nature, is typically made to a depth of approximately 0.7 mil and results in a surface concentration of about $5\times10^{15}$ atoms/cm.$^3$. The p-type region 16*b* will ultimately form the collector of a PNP transistor, region 16*c* will form a subepitaxial diffused resistor, region 16*e* a back gate for an n-channel FET, and regions 16*a*, 16*d* and 16*f*** will provide electrical isolation of an NPN transistor, a surface diffused resistor and a p-channel FET.

Next a diffusion window 20 is cut in the oxide 18 over the p-type region **16*a***, as illustrated in FIGURES 2*a* and 2*b*. N-type impurities, such as antimony or arsenic, are then diffused through window 20 in a conventional manner to form the relatively heavily doped n-type region 22. In a preferred embodiment, antimony is the impurity employed. Diffusion is to a depth of about 0.3 mil with a surface concentration of approximately $10^{19}$ atoms/cm.$^3$. Region 22 will form a low resistivity subsurface path for current to the collector region of the NPN transistor.

Next the oxide layer is stripped and a lightly doped n-type epitaxial layer 24 is grown over the silicon slice as illustrated in FIGURES 3*a* and 3*b*. Any suitable epitaxial process can be used for this purpose such as the known process wherein silane tetrachloride ($SiCl_4$) carried by hydrogen gas is thermally decomposed by passing the gaseous mixture over the substrate when heated to about 1250° C. for about five minutes. The epitaxial layer is preferably formed in an antimony atmosphere which furnishes n-type impurities to produce the relatively lightly doped n-type layer 24. The epitaxial layer may typically be about 0.5 mil thick and have a resistance of about 2.0 ohms-cm.

Next a p-type impurity, preferably boron, is diffused into epitaxial layer 24 to form regions **26*a*–26*f*. With an epitaxial layer thickness of about 0.5 mil, this diffusion is typically made about 0.5–0.6 mil deep to extend through the epitaxial layer and has a relatively heavy surface concentration of about $10^{20}$ atoms/cm.$^3$. In this embodiment of the invention, diffused region 26*b* provides a low resistivity current path to the underlying collector region 16*b* of the PNP transistor. Region 26*c* is separated in two parts located at opposite ends of the subepitaxial resistor 16*c* to provide surface contact regions for the ends of the buried resistor. Region 26*e* establishes deep ohmic contact with diffused region 16*e* which is the back gate of an n-channel field effect transistor. Regions 26*a*, 26*d* and 26*f* extend around the peripheries of regions 16*a*, 16*d* and 16*f*** and form electrical isolation rings in the conventional manner.

As illustrated in FIGURES *5a* and *5b*, a p-type diffusion, preferably boron, is then made in regions 28*a*, 28*b*, 28*d*–28*f* to convert the epitaxial layer from n-type conductivity to p-type conductivity. A typical diffusion depth is about 0.25 mil with a surface concentration of about $10^{18}$ atoms/cm.$^3$. Region 28*a* forms the base of the NPN transistor. Region 28*b* forms the emitter of the PNP transistor. Region 28*d* forms a diffused surface resistor. Region 28*e* forms a gate diffusion for an n-channel field effect transistor, and region 28*f* forms the channel for the p-channel field effect transistor.

Finally, an n-type impurity, preferably phosphorus, is diffused to form n-type conductivity regions 30–36 as shown in FIGURES *6a* and *6b*. The depth of this diffusion is typically about 0.18 mil and the surfac e concentration is approximately $10^{21}$ atoms/cm.$^3$. Diffused region 30 forms the emitter of the NPN transistor. Region 31 provides a means for establishing ohmic contact with the high resistivity n-type region 22 which provides a low resistivity current path to the active collector region of the NPN transistor. The diffused regions 32 may be placed around any one or more of the components to form a guard ring and prevent surface inversion. Regions 33 and 34 provide a source and a drain contact, respectively, for the n-channel field effect transistor, and area 35 forms a diffused front gate region for the p-channel field effect transistor.

From FIGURES *6a* and *6b*, it will be noted that the process heretofore described can be used to concurrently fabricate NPN and PNP transistors, subepitaxial resistors, diffused surface resistors, n-channel field effect transistors, and p-channel field effect transistors. The subepitaxial n-type region under the NPN device provides a collector saturation resistance on the order of 50 to 100 times better than present topside contact devices on complementary monolithic structures. Further, the collector-base breakdown voltages are substantially equal on both the PNP and the NPN devices. In addition to these advantages, this process permits the construction of a PNP device having an extremely high emitter-base breakdown voltage on the order of about 100 volts.

The subepitaxial diffused resistor which may be constructed in the integrated circuit by this process enables the circuit to operate under high voltage conditions without the breakdown problems of surface resistors built by prior art processes. Placing the lightly doped low conductivity p-type regions below the epitaxial layer eliminates inversion difficulties, and minimizes breakdowns attributable to surface defects of the initial material and defects induced by the diffusion processes. Surface inversion is no problem because the resistor is well below the surface. Degradation from defects in the starting material is minimized because the density of such defects tends to decrease beneath the surface. Since surface inversion is no problem, the sheet resistance of the subepitaxial resistor may be as much as five times the sheet resistance of a standard surface diffusion. For example, nominal values for standard surface diffused resistors are 150 ohms per square, as opposed to 750 ohms per square available in subepitaxial resistors fabricated in accordance with this invention. Thus, not only is more resistance obtainable for less length, the use of such subsurface resistors allows more complex connections to be achieved, since the resistors form another level of interconnections which tunnel under other circuit elements and surface interconnections.

Although a preferred embodiment of the invention has been described in detail, it is to be understood that various changes, substitutions and alterations can be made therein without departing from the spirit and scope of the invention as defined by the appended claims.

What is claimed is:

1. A monolithic integrated circuit including a matched pair of complementary transistors, comprising in combination:

(a) a substrate of one conductivity type;

(b) a plurality of spaced diffused regions of opposite conductivity type formed in said substrate and extending to one surface thereof;

(c) an epitaxial layer of said one conductivity type extending over substantially the entire area of said one surface of said substrate;

(d) a plurality of diffused rings of said opposite conductivity type extending through said epitaxial layer to said one surface of said substrate so as to form a plurality of pockets in said epitaxial layer respectively contiguous with said spaced regions;

(e) a first transistor formed within a first one of said pockets, said first transistor including:

(1) a diffused base region of said opposite conductivity type formed within said first pocket, (2) a diffused emitter region of said one conductivity type formed within said base region, wherein (3) the epitaxial layer isolated within said first pocket forms the collector region of said first transistor;

(f) a second transistor formed within a second one of said pockets, said second transistor including:

(1) a diffused emitter region of said opposite conductivity type formed within said second pocket, wherein (2) the epitaxial layer isolated within said second pocket forms the base region of said second transistor, and wherein (3) the respective spaced region contiguous with said second pocket forms the collector region of said second transistor; and (g) a buried diffused region of said one conductivity type formed within the spaced region that is contiguous with said first pocket, said buried region underlying its respective base and emitter regions so as to provide a low resistivity path for collector current in said first transistor wherein (h) the diffused ring that forms said first pocket and the respective spaced region provide electrical isolation of said first transistor; and wherein (i) the diffused ring that forms said second pocket provides surface ohmic contact to said collector region.

2. The monolithic integrated circuit of claim 1 and further including diffused guard regions of said one conductivity type extending at least partially into said epitaxial layer and selectively circumscribing said diffused rings so as to prevent surface inversion.

3. The monolithic integrated circuit of claim 2 wherein said one conductivity type is p-type, said other conductivity type is n-type and said first and second transistors are NPN and PNP transistors, respectively.

4. The monolithic integrated circuit of claim 2 and further including:

(a) a sub-epitaxial resistor formed within a third one of said pockets wherein (1) the spaced region contiguous to said third pocket forms the resistor region of said sub-epitaxial resistor, and (2) the diffused ring that forms said third pocket is discontinuous to form two parts positioned at opposite ends of said resistor region and provide surface resistor contact regions for said opposite ends of said resistor region.

5. The monolithic integrated circuit of claim 2 and further including:

(a) a surface resistor formed within a third one of said pockets, said surface resistor including (1) a diffused resistor region of said opposite conductivity type formed within said third pocket; wherein (2) the diffused ring that forms said third pocket and the spaced region that is contiguous to said third pocket provide electrical isolation for said resistor region.

6. The monolithic integrated circuit of claim 2 and further including:

(a) an n-channel FET formed within a third one of said pockets including (1) a diffused front gate region of said opposite conductivity formed within said third pocket, and (2) source and drain contact regions of said one conductivity type formed within said third pocket spaced from said gate region and spaced from each other, wherein (3) the spaced region that is contiguous with said third pocket forms the back gate region of said n-channel FET, and wherein (4) the epitaxial layer within said third pocket forms the channel region of the n-channel FET, and wherein (5) the diffused ring that forms said third pocket provides surface ohmic contact to said back gate region.

7. The monolithic integrated circuit of claim 2 and further including:

(a) a p-channel FET formed within a third one of said pockets including (1) a diffused channel region of said opposite conductivity type formed within said third pocket, and (2) a diffused front gate region of said one conductivity type formed within said channel region, wherein (3) the epitaxial layer within said third pocket forms the back gate region of said p-channel FET, and wherein (4) the diffused ring that forms said third pocket and the spaced region that is contiguous to said fifth pocket provide electrical isolation for said p-channel FET.

References Cited

UNITED STATES PATENTS

| | | | |
|---|---|---|---|
| 3,423,653 | 1/1969 | Chang | 317—235 |
| 3,414,783 | 12/1968 | Moore | 317—235 |
| 3,423,650 | 1/1969 | Cohen | 317—234 |
| 3,404,321 | 10/1968 | Kurosawa | 317—235 |
| 3,404,450 | 10/1968 | Karcher | 29—577 |
| 3,327,182 | 6/1967 | Kisinko | 317—235 |
| 3,380,153 | 4/1968 | Kisinko | 29—577 |
| 3,370,995 | 2/1968 | Lowery | 148—175 |
| 3,387,193 | 6/1968 | Donald | 317—235 |
| 3,299,329 | 1/1967 | Pollock | 317—235 |
| 3,278,853 | 10/1966 | Lin | 330—24 |

JOHN W. HUCKERT, Primary Examiner

M. H. EDLOW, Assistant Examiner

U.S. Cl. X.R.

317—234; 148—186, 176